United States Patent
Chin et al.

(10) Patent No.: US 11,158,995 B2
(45) Date of Patent: Oct. 26, 2021

(54) LASER DIODE WITH DEFECT BLOCKING LAYER

(71) Applicant: VISUAL PHOTONICS EPITAXY CO., LTD., Taoyuan (TW)

(72) Inventors: Yu-Chung Chin, Taoyuan (TW); Chao-Hsing Huang, Taoyuan (TW); Van-Truong Dai, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 0 days.

(21) Appl. No.: 16/424,569

(22) Filed: May 29, 2019

(65) Prior Publication Data
US 2019/0372310 A1 Dec. 5, 2019

(30) Foreign Application Priority Data

Jun. 1, 2018 (TW) .................................. 107118985

(51) Int. Cl.
*H01S 5/02* (2006.01)
*H01S 5/34* (2006.01)
*H01S 5/125* (2006.01)

(52) U.S. Cl.
CPC .......... *H01S 5/3407* (2013.01); *H01S 5/0206* (2013.01); *H01S 5/125* (2013.01); *H01S 2301/173* (2013.01)

(58) Field of Classification Search
CPC ........................ H01S 2301/173; H01S 5/0206
See application file for complete search history.

(56) References Cited

U.S. PATENT DOCUMENTS

| 4,809,287 A * | 2/1989 | Ohba | H01S 5/20 372/45.01 |
| 5,204,871 A * | 4/1993 | Larkins | G02F 3/026 257/12 |
| 2002/0154675 A1* | 10/2002 | Deng | B82Y 10/00 372/96 |
| 2003/0007528 A1* | 1/2003 | Uchiyama | H01S 5/18313 372/46.013 |
| 2005/0121678 A1* | 6/2005 | Ezaki | H01S 5/18355 257/79 |
| 2006/0133440 A1* | 6/2006 | Kim | B82Y 20/00 372/45.01 |
| 2010/0166033 A1 | 7/2010 | Chin et al. | |

FOREIGN PATENT DOCUMENTS

| TW | 201019377 | 5/2010 |
| TW | 201029236 | 8/2010 |

OTHER PUBLICATIONS

Sze and Ng, "Physics of Semiconductor Devices," 2007, John Wiley &Sons, third edition, pp. 16-17. (Year: 2007).*

* cited by examiner

*Primary Examiner* — Michael Carter
(74) *Attorney, Agent, or Firm* — Amin, Turocy & Watson, LLP (57) ABSTRACT

A laser diode is provided, including at least a defect blocking layer deposited between the GaAs substrate and the active layer, so that the crystal defects of the GaAs substrate can be blocked or reduced from propagation to the active layer when the epitaxial layer is formed on the GaAs substrate. As such, the crystal quality of the active layer can be improved, thereby improving the reliability and optical property of the laser diode.

10 Claims, 10 Drawing Sheets

LASER DIODE WITH DEFECT BLOCKING LAYER

CROSS-REFERENCE TO RELATED APPLICATION

This application claims the priority of Taiwanese patent application No. 107118985, filed on Jun. 1, 2018, which is incorporated herewith by reference.

BACKGROUND OF THE INVENTION

1. Field of the Invention

The present invention relates generally to a laser diode, and more particularly, to a surface-emitting or edge-emitting laser diode provided with a defect blocking layer in the structure.

2. The Prior Arts

Figure 1:
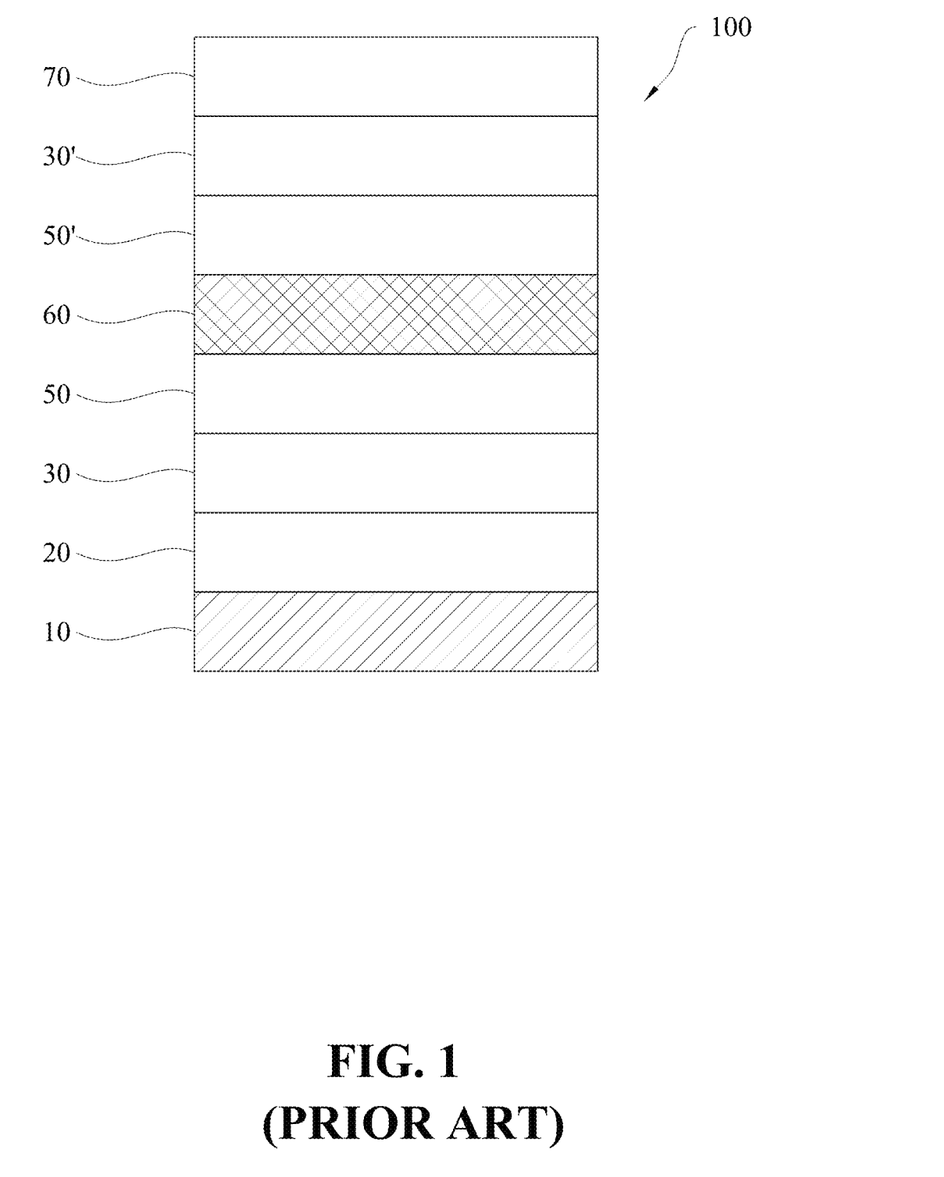
FIG. 1 is a schematic diagram illustrating the structure of a surface-emitting laser diode in the prior art.

In general, a laser diode is exemplified by a surface-emitting laser diode as shown in FIG. 1. The manufacturing process includes: using a GaAs wafer as a substrate and utilizing Metal-Organic Chemical Vapor Deposition (MOCVD) or Molecular Beam Epitaxy (MBE) equipment and epitaxial growth on the substrate to sequentially form a lower distributed Bragg reflector (DBR) layer, a lower spacer layer, an active (quantum well structure) layer, an upper spacer layer, an upper DBR layer, and an ohmic contact layer. With the exception of the substrate, the laser diode is basically formed by epitaxial growth.

Epitaxial growth must be carried out under strict conditions. For example, a single crystal wafer must be used as a substrate, so that the lattice constant of epitaxial layers are close to that of the substrate. However, in practical applications, the substrate used is not a perfect single crystal in which crystal defects such as etch-pit density (EPD), dislocation, point defect, or defects caused by dopant species or stress will gradually propagate along with the epitaxial crystal growth, increasing the defect density in the active layer of laser diode, which will affect the optical property of laser diode, and also creates reliability issue.

In the prior art, in order to reduce the impact on the active layer from the substrate defects, it is necessary to improve the substrate manufacturing process including the substrate doping concentration uniformity. However, it is difficult to form a perfect crystal without defects and form highly uniform doped substrate in the substrate manufacturing process, so the reliability of the laser diode cannot be further improved. In addition, a substrate having a crystal defect may also cause a substrate manufacturing yield loss due to a tight crystal defect specification, which in turn makes cost reduction difficult.

SUMMARY OF THE INVENTION

In view of the above technical problems of the prior art, a primary objective of the present invention is to provide a laser diode with a defect blocking layer capable of blocking or reducing the defects propagation from the substrate to the active layer to improve the reliability and optical property of the laser diode.

Another objective of the present invention is to provide a laser diode with a defect blocking layer capable of blocking or reducing the defects propagation from the substrate to the active layer, thereby loosening the crystal defect specification of substrate, improving substrate manufacturing yield rate and thus reduce the substrate cost.

To achieve the foregoing objectives, the present invention provides a surface-emitting laser diode with defect blocking layer, the structure of which at least comprises: a GaAs substrate; an active layer; and at least a defect blocking layer, deposited between the GaAs substrate and the active layer, and directly or indirectly on the GaAs substrate to block or reduce defects propagation from the GaAs substrate to the active layer, wherein the material of the defect blocking layer is carbon-doped InGaAsP, carbon-doped InGaP, carbon-doped InAlGaP, carbon-doped InAlAsP, carbon-doped InAlGaAsP, carbon-doped GaAs, carbon-doped AlGaAs, carbon-doped AlGaAsP, oxygen-doped AlGaAs, oxygen-doped AlGaAsP, oxygen-doped InAlGaP, oxygen-doped InAlAsP, oxygen-doped InAlGaAsP, silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP.

According to an embodiment of the present invention, the active layer comprises at least a layer of quantum well structure.

According to an embodiment of the present invention, there are two or more defect blocking layers, and the defect blocking layers are stacked directly or stacked indirectly.

According to an embodiment of the present invention, the defect blocking layer has a thickness of from 1 nm to 10000 nm.

According to an embodiment of the present invention, the GaAs substrate is an n-type, a p-type, or a semi-insulating substrate.

According to an embodiment of the present invention, the GaAs substrate is an n-type substrate, and the defect blocking layer deposited directly or indirectly on the GaAs substrate, the material of the defect blocking layer is silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP.

According to an embodiment of the present invention, the GaAs substrate is a p-type substrate, and the defect blocking layer deposited directly or indirectly on the GaAs substrate, the material of the defect blocking layer is carbon-doped InAlGaP, carbon-doped InAlAsP, carbon-doped InAlGaAsP, carbon-doped GaAs, carbon-doped AlGaAs or carbon-doped AlGaAsP.

According to an embodiment of the present invention, in the case where the GaAs substrate is removed, the material of the defect blocking layer is carbon-doped InGaAsP, carbon-doped InGaP, carbon-doped InAlGaP, carbon-doped InAlAsP, carbon-doped InAlGaAsP, carbon-doped GaAs, carbon-doped AlGaAs, carbon-doped AlGaAsP, oxygen-doped AlGaAs, oxygen-doped AlGaAsP, oxygen-doped InAlGaP, oxygen-doped InAlAsP, oxygen-doped InAlGaAsP, silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP.

The present invention also provides an edge-emitting laser diode with defect blocking layer, the structure of which at least comprises: a GaAs substrate; an active layer; and at least a defect blocking layer, deposited between the GaAs substrate and the active layer, and directly or indirectly on the GaAs substrate to block or reduce defect propagation from the GaAs substrate to the active layer, wherein the material of the defect blocking layer is carbon-doped InGaAsP, carbon-doped InGaP, carbon-doped InAlGaP, carbon-doped InAlAsP, carbon-doped InAlGaAsP, carbon-doped GaAs, carbon-doped AlGaAs, carbon-doped AlGaAsP, oxygen-doped AlGaAs, oxygen-doped AlGaAsP, oxygen-doped InAlGaP, oxygen-doped InAlAsP, oxygen-doped InAlGaAsP, silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP.

According to an embodiment of the present invention, the active layer comprises at least a layer of quantum well structure.

According to an embodiment of the present invention, there are two or more defect blocking layers, and the defect blocking layers are stacked directly or stacked indirectly.

According to an embodiment of the present invention, the defect blocking layer has a thickness of from 1 nm to 10000 nm.

According to an embodiment of the present invention, the GaAs substrate is an n-type, a p-type, or a semi-insulating substrate.

According to an embodiment of the present invention, the GaAs substrate is an n-type substrate, and the defect blocking layer deposited directly or indirectly on the GaAs substrate, the material of the defect blocking layer is silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP.

According to an embodiment of the present invention, the GaAs substrate is a p-type substrate, and the defect blocking layer deposited directly or indirectly on the GaAs substrate, the material of the defect blocking layer is carbon-doped InAlGaP, carbon-doped InAlAsP, carbon-doped InAlGaAsP, carbon-doped GaAs, carbon-doped AlGaAs or carbon-doped AlGaAsP.

According to an embodiment of the present invention, in the case where the GaAs substrate is removed, the material of the defect blocking layer is carbon-doped InGaAsP, carbon-doped InGaP, carbon-doped InAlGaP, carbon-doped InAlAsP, carbon-doped InAlGaAsP, carbon-doped GaAs, carbon-doped AlGaAs, carbon-doped AlGaAsP, oxygen-doped AlGaAs, oxygen-doped AlGaAsP, oxygen-doped InAlGaP, oxygen-doped InAlAsP, oxygen-doped InAlGaAsP, silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

In practice, the buffer layer in the laser diode can be used but it is optional. In some cases, the buffer layer is the same material as the substrate. Whether the buffer layer is deposited is irrelevant to the following technical features and the provided effects to be described. Therefore, for simplicity, the following embodiment of a laser diode having a buffer layer is only for illustrative purposes, and an embodiment of a laser diode without a buffer layer is omitted. That is, the following embodiment is also applicable to a laser diode without a buffer layer.

Referring to FIG. 1, FIG. 1 is a schematic diagram illustrating the structure of a surface-emitting laser diode 100 in the prior art, which comprises: from bottom up, a GaAs substrate 10, a buffer layer 20, a lower DBR layer 30, a lower spacer layer 50, a quantum well layer 60 (as an active layer), an upper spacer layer 50', an upper DBR layer 30', and an ohmic contact layer 70, wherein the quantum well layer 60 can be comprised of at least a layer of quantum well structure. The GaAs substrate 10 is a single crystal manufactured by using a vertical bridgman (VB) method, a vertical gradient freezing (VGF) method or a liquid encapsulation Czochralski (LEC) method. The buffer layer 20, the lower DBR layer 30, the lower spacer layer 50, the quantum well layer 60, the upper spacer layer 50', the upper DBR layer 30', and the ohmic contact layer 70 are made of a conventional semiconductor material and formed by epitaxial growth method. The semiconductor material will not be described here. Although the GaAs substrate 10 is substantially a single crystal, but it is not defect free. Therefore, when growing epitaxial layer on the GaAs substrate 10, defects from the GaAs substrate 10 will propagate during the epi growth, resulting in increasing of defects in the quantum well layer 60, and the defects will degrade the optical property and reliability of the laser diode 100.

Figure 2:
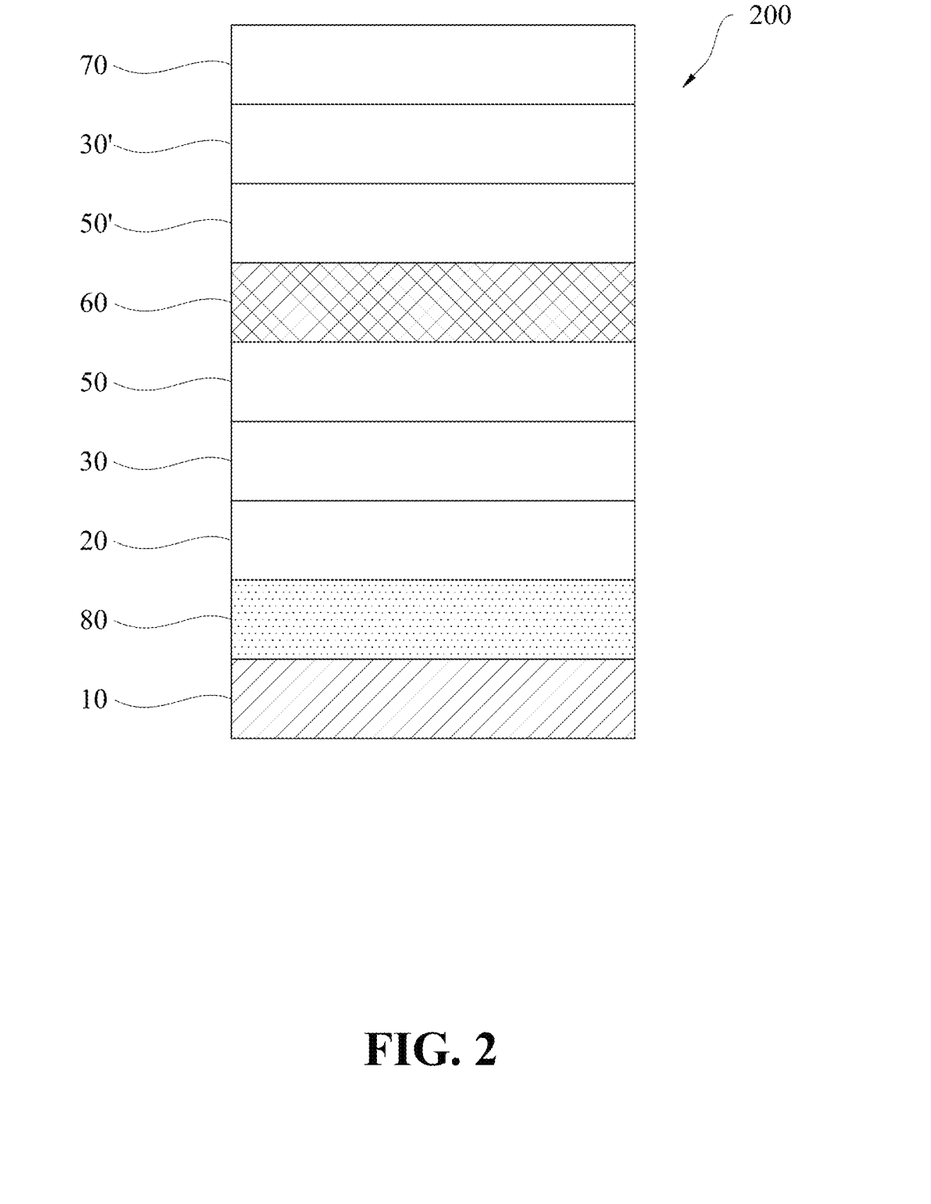
FIG. 2 is a schematic diagram illustrating the structure of a surface-emitting laser diode with a single defect blocking layer according to an embodiment of the present invention.

Therefore, as shown in FIG. 2, an embodiment of the present invention provides a surface-emitting laser diode 200 capable of blocking or reducing the defects propagation from the substrate 10 to the quantum well layer 60. The structure of the surface-emitting laser diode 200 comprises, from bottom up, a GaAs substrate 10, a defect blocking layer 80, a buffer layer 20, a lower DBR layer 30, a lower spacer layer 50, a quantum well layer 60, an upper spacer layer 50', an upper DBR layer 30', and an ohmic contact layer 70. However, the structure between the GaAs substrate 10 and the quantum well layer 60 is not limited to only the buffer layer 20, the lower DBR layer 30, and the lower spacer layer 50, and other structures may be provided as needed: for example, another unillustrated ohmic contact layer is deposited in the buffer layer 20, in the lower DBR layer 30, or between the buffer layer 20 and the lower DBR layer 30, so that the p-type and n-type ohmic contacts of the surface-emitting laser can be manufactured on the front side of the wafer. Further, the buffer layer 20 or the lower DBR layer 30 can also be directly used as an ohmic contact layer. Wherein, FIG. 2 shows that the defect blocking layer 80 is deposited between the GaAs substrate 10 and the buffer layer 20, that is, directly deposited on the GaAs substrate 10, to prevent or reduce the defect of the GaAs substrate 10 to be propagated to the structural layers above the buffer layer 20.

Preferably, in an embodiment not shown, the defect blocking layer 80 may also be deposited between the GaAs substrate 10 and the quantum well layer 60, and indirectly deposited on the GaAs substrate 10. The indirect arrangement is exemplified, but not limited to, in the buffer layer 20, between the buffer layer 20 and the lower DBR layer 30, in the lower DBR layer 30, between the lower DBR layer 30 and the lower spacer layer 50, in the lower spacer layer 50, or between the lower spacer layer 50 and the quantum well layer 60, which can also reduce crystal defects in the quantum well layer 60.

Figure 3:
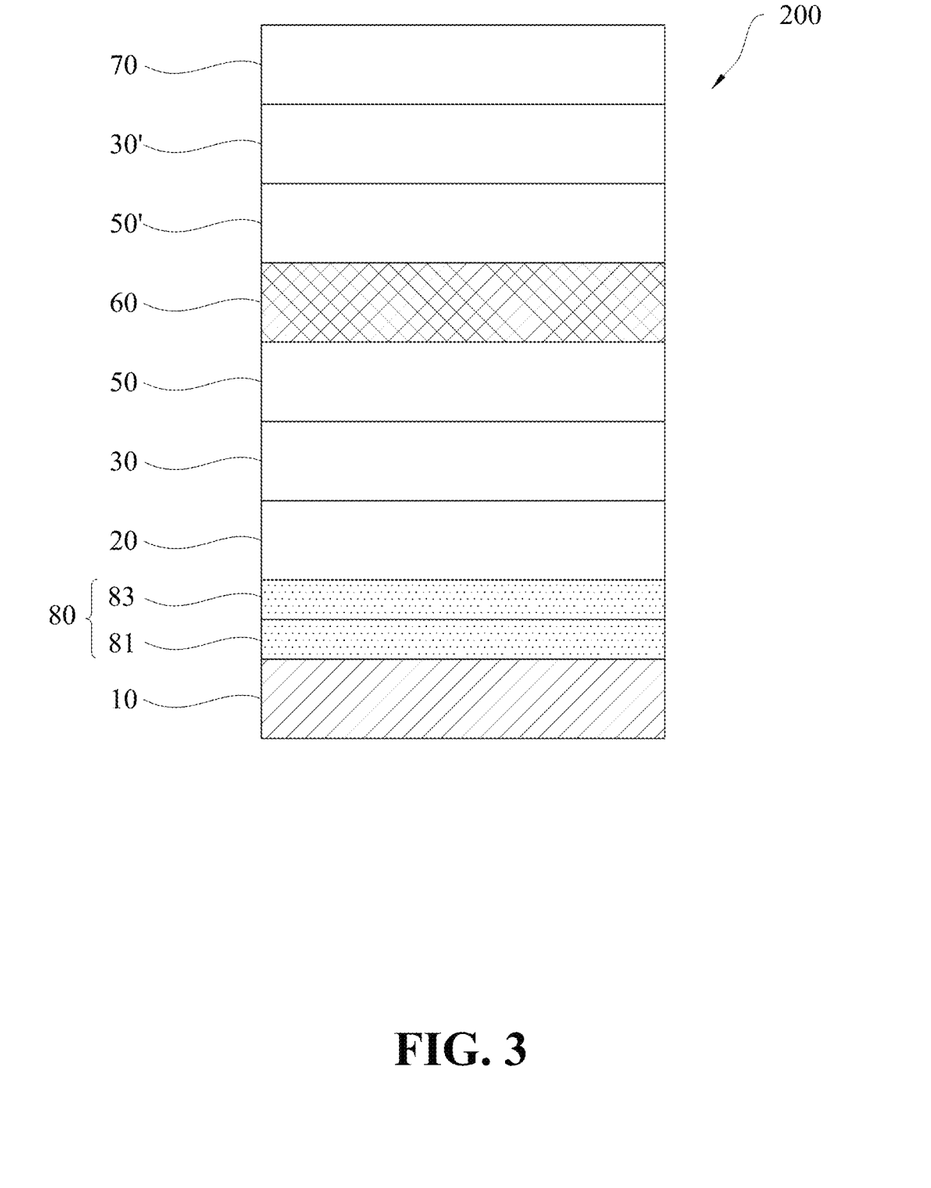
FIG. 3 is a schematic diagram illustrating the structure of a surface-emitting laser diode with a plurality of defect blocking layers stacked directly in an embodiment of the present invention.

Preferably, the defect blocking layer 80 may be a single-layer structure or a multilayer structure, and the material of the defect blocking layer 80 may be carbon-doped InGaAsP, carbon-doped InGaP, carbon-doped InAlGaP, carbon-doped InAlAsP, carbon-doped InAlGaAsP, carbon-doped GaAs, carbon-doped AlGaAs, carbon-doped AlGaAsP, oxygen-doped AlGaAs, oxygen-doped AlGaAsP, oxygen-doped InAlGaP, oxygen-doped InAlAsP, oxygen-doped InAlGaAsP, silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP. When the defect blocking layer has a multilayer structure, for example, as shown in FIG. 3, the defect blocking layer 80 is formed by a first defect blocking layer 81 and a second defect blocking layer 83 stacked directly.

Preferably, when doping carbon in the defect blocking layer 80, the doping concentration may be $1 \times 10^{18}$ cm$^{-3}$ or more, preferably $1 \times 10^{19}$ cm$^{-3}$ or more; when doping oxygen, the doping concentration may be $1 \times 10^{18}$ cm$^{-3}$ or more, preferably $1 \times 10^{19}$ cm$^{-3}$ or more; when doping any one of silicon, tin, tellurium or selenium, the doping concentration may be $5 \times 10^{17}$ cm$^{-3}$ or more, preferably $5 \times 10^{18}$ cm$^{-3}$ or more. Higher doping concentrations generally exhibit better blocking properties. In addition, in the case where the defect blocking layer 80 is made of the same material, doping with silicon, tin, tellurium or selenium shows better defect blocking than undoped, but doping with carbon or oxygen shows the best.

Preferably, the total thickness of the defect blocking layer 80 may be 1 nm to 10000 nm, or the first defect blocking layer 81 and the second defect blocking layer 83 may be 1 nm to 10000 nm in thickness, respectively.

Preferably, depending on application, the GaAs substrate 10 can be an n-type, a p-type or a semi-insulating substrate.

Preferably, when the GaAs substrate 10 is an n-type substrate, the defect blocking layer 80 deposited on the GaAs substrate 10 may be a single-layer structure or a multilayer structure, and the material of the defect blocking layer 80 may be silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP. As such, no PN junction will be formed between the n-type GaAs substrate 10 and the defect blocking layer 80 to contribute extra resistance, and this can block or reduce crystal defect propagation from the GaAs substrate 10 toward the quantum well layer 60, thereby improving the reliability and optical property of the surface-emitting laser diode 200.

Preferably, when the GaAs substrate 10 is a p-type substrate, the defect blocking layer 80 deposited on the GaAs substrate 10 may be a single-layer structure or a multilayer structure, and the material of the defect blocking layer 80 may be carbon-doped InAlGaP, carbon-doped InAlAsP, carbon-doped InAlGaAsP, carbon-doped GaAs, carbon-doped AlGaAs or carbon-doped AlGaAsP. As such, no PN junction will be formed between the p-type GaAs substrate 10 and the defect blocking layer 80, to contribute extra resistance and this can block or reduce crystal defect propagation from the GaAs substrate 10 toward the quantum well layer 60, thereby improving the reliability and optical property of the surface-emitting laser diode 200.

Preferably, when the GaAs substrate 10 is a semi-insulating substrate, the defect blocking layer 80 deposited on the GaAs substrate 10 may be a single-layer structure or a multilayer structure, and the material of the defect blocking layer 80 may be carbon-doped InGaAsP, carbon-doped InGaP, carbon-doped InAlGaP, carbon-doped InAlAsP, carbon-doped InAlGaAsP, carbon-doped GaAs, carbon-doped AlGaAs, carbon-doped AlGaAsP, oxygen-doped AlGaAs, oxygen-doped AlGaAsP, oxygen-doped InAlGaP, oxygen-doped InAlAsP, oxygen-doped InAlGaAsP, silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP. As such, the defect blocking layer 80 can block or reduce crystal defect propagation from the GaAs substrate 10 toward the quantum well layer 60, thereby improving the reliability and optical property of the surface-emitting laser diode 200.

Figure 4:
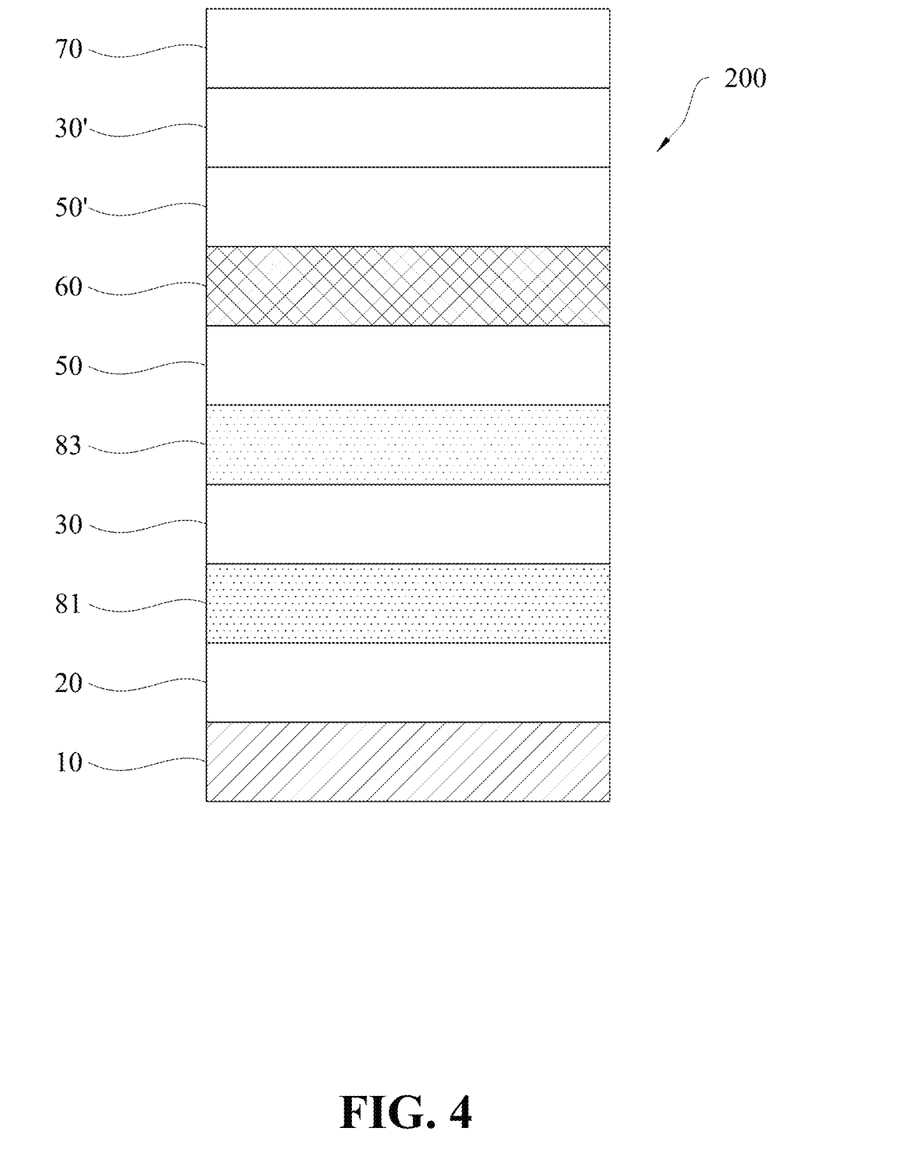
FIG. 4 is a schematic diagram illustrating the structure of a surface-emitting laser diode with a plurality of defect blocking layers stacked indirectly in an embodiment of the present invention.

As shown in FIG. 4, the multilayer defect blocking layer in the surface-emitting laser diode 200 may also be an indirect stack where the layers are not adjacent to each other. For example, the first defect blocking layer 81 may be deposited between the buffer layer 20 and the lower DBR layer 30 (indirectly deposited on the GaAs substrate 10), the second defect blocking layer 83 may be deposited between the lower DBR layer 30 and the lower spacer layer 50 (indirectly deposited on the GaAs substrate 10).

Preferably, when the surface-emitting laser diode 200 includes two or more defect blocking layers, the defect blocking layers may be respectively deposited at two or more of the following locations: between the GaAs substrate 10 and the buffer layer 20, in the buffer layer 20, between the buffer layer 20 and the lower DBR layers 30, in the lower DBR layer 30, between the lower DBR layer 30 and the lower spacer layer 50, in the lower spacer layer 50, or between the lower spacer layer 50 and the quantum well layer 60.

Figure 5:
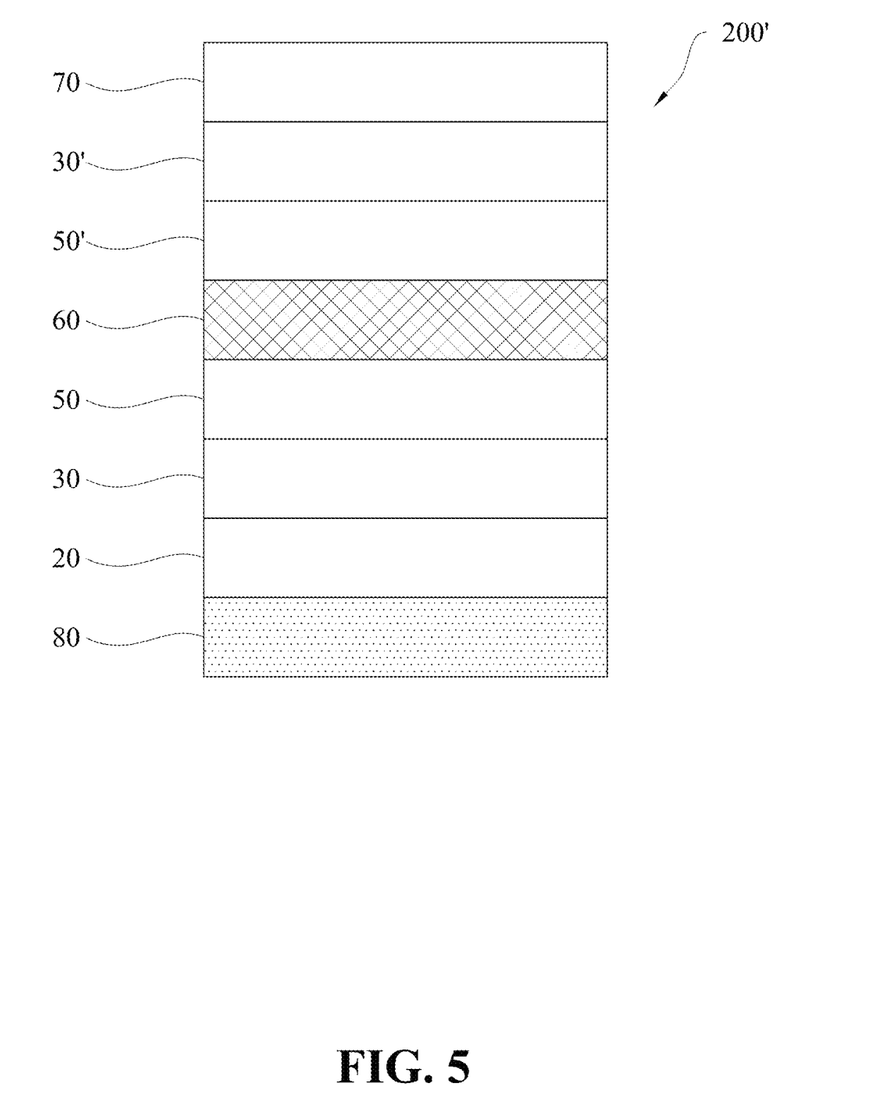
FIG. 5 is a schematic diagram illustrating the structure of a surface-emitting laser diode with substrate removed according to an embodiment of the invention.

Moreover, in an embodiment of the present invention, depending on the application, the GaAs substrate 10 may be removed after manufacturing the surface-emitting laser diode 200. For example, by removing the GaAs substrate 10 from the surface-emitting laser diode 200 in FIG. 2, a laser diode 200' shown in FIG. 5 is obtained. At this point, the defect blocking layer 80 may be a single-layer structure or a multilayer structure, and the material of the defect blocking layer 80 may be carbon-doped InGaAsP, carbon-doped InGaP, carbon-doped InAlGaP, carbon-doped InAlAsP, carbon-doped InAlGaAsP, carbon-doped GaAs, carbon-doped AlGaAs, carbon-doped AlGaAsP, oxygen-doped AlGaAs, oxygen-doped AlGaAsP, oxygen-doped InAlGaP, oxygen-doped InAlAsP, oxygen-doped InAlGaAsP, silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP.

With the description of the above embodiments, as long as the surface-emitting laser diode of the present invention can provide at least one defect blocking layer under the quantum well layer (as the active layer), the defect blocking layer can block or reduce the crystal defects of the GaAs substrate propagating upward, thereby reducing crystal defects in the quantum well layer, and the reliability and optical property of the laser diode are improved. In addition, the defect blocking layer can also reduce the crystal defect specification requirements of the substrate, and relatively increase the substrate manufacturing yield, thereby further reducing the cost.

In pratical, the buffer layer in the laser diode can be used but it is optional. In some cases, the buffer layer is the same material as the substrate, Whether the buffer layer is disposed is irrelevant to the following technical features and the provided effects to be described. Therefore, for simplicity, the following embodiment of a laser diode having a buffer layer is only for illustrative purposes, and an embodiment of a laser diode without a buffer layer is omitted. That is, the following embodiment is also applicable to a laser diode without a buffer layer.

Figure 6:
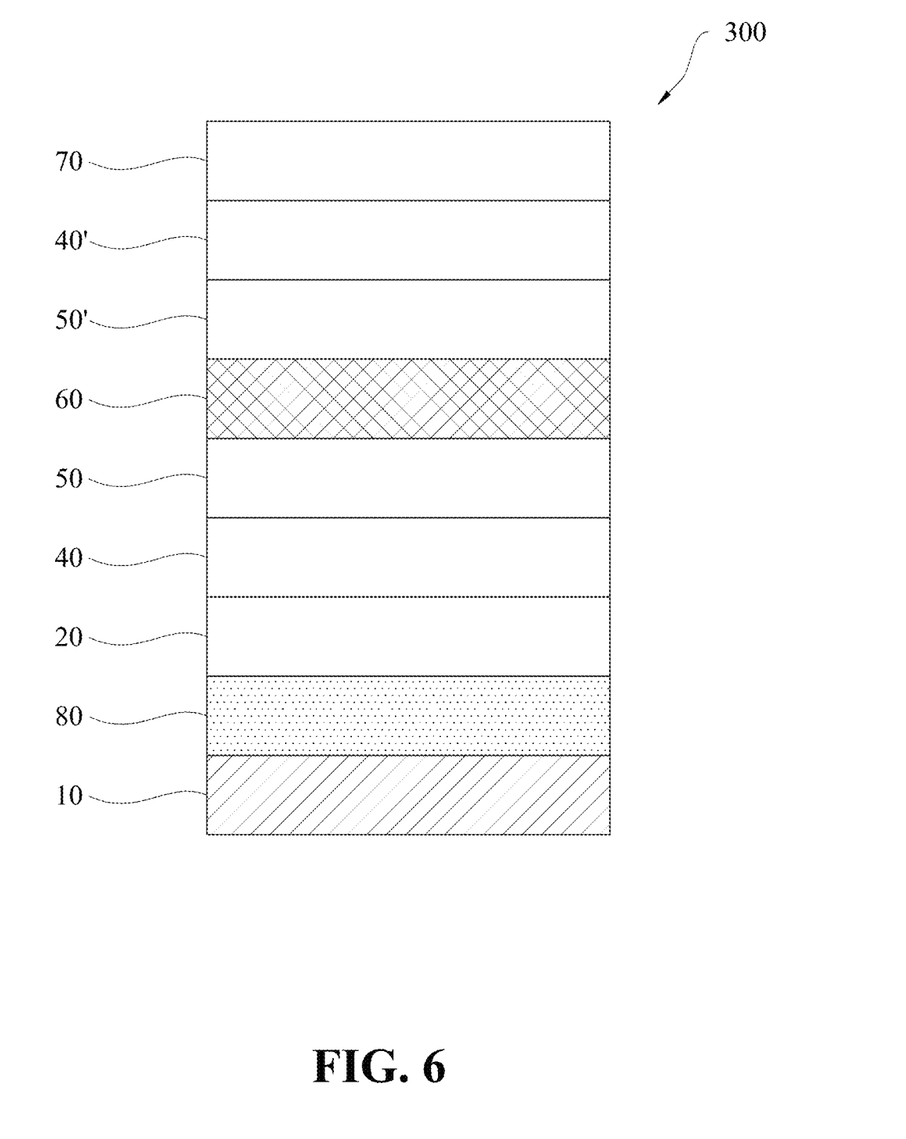
FIG. 6 is a schematic diagram illustrating the structure of an edge-emitting laser diode with a single defect blocking layer according to an embodiment of the present invention.

Furthermore, as shown in FIG. 6, another example of the present invention provides an edge-emitting laser diode 300 capable of preventing the crystal defects of the substrate from being propagated to the quantum well layer 60, comprising: from the bottom up, a GaAs substrate 10, a defect blocking layer 80, a buffer layer 20, a lower cladding layer 40, a lower spacer layer 50, a quantum well layer 60, an upper spacer layer 50', an upper cladding layer 40', and an ohmic contact layer 70. The buffer layer 20, a lower cladding layer 40, a lower spacer layer 50, a quantum well layer 60, an upper spacer layer 50', an upper cladding layer 40', and an ohmic contact layer 70 are formed by using conventional semiconductor materials and are formed by epitaxial growth method, and the semiconductor materials are not described herein. However, the structure between the GaAs substrate 10 and the quantum well layer 60 is not limited to only the buffer layer 20, the lower cladding layer 40, and the lower spacer layer 50, and other structures may be provided as needed: for example, another unillustrated ohmic contact layer is deposited in the buffer layer 20, in the lower cladding layer 40, or between the buffer layer 20 and the and the lower cladding layer 40, so that the p-type and n-type ohmic contacts of the edge-emitting laser diode can be manufactured on the front side of the wafer. Further, the buffer layer 20 or the lower cladding layer 40 can also be directly used as an ohmic contact layer. Wherein, FIG. 6 shows that the defect blocking layer 80 is deposited between the GaAs substrate 10 and the buffer layer 20, that is, directly disposed on the GaAs substrate 10, to prevent or reduce the defect of the GaAs substrate 10 to be propagated to the structural layers above the buffer layer 20.

Preferably, in an embodiment not shown, the defect blocking layer 80 may also be deposited between the GaAs substrate 10 and the quantum well layer 60, and indirectly deposited on the GaAs substrate 10. The indirect arrangement is exemplified, but not limited to, in the buffer layer 20, between the buffer layer 20 and the lower cladding layer 40, in the lower cladding layer 40, between the lower cladding layer 40 and the lower spacer layer 50, in the lower spacer layer 50, or between the lower spacer layer 50 and the quantum well layer 60, which can also reduce the defects in the quantum well layer 60.

Figure 7:
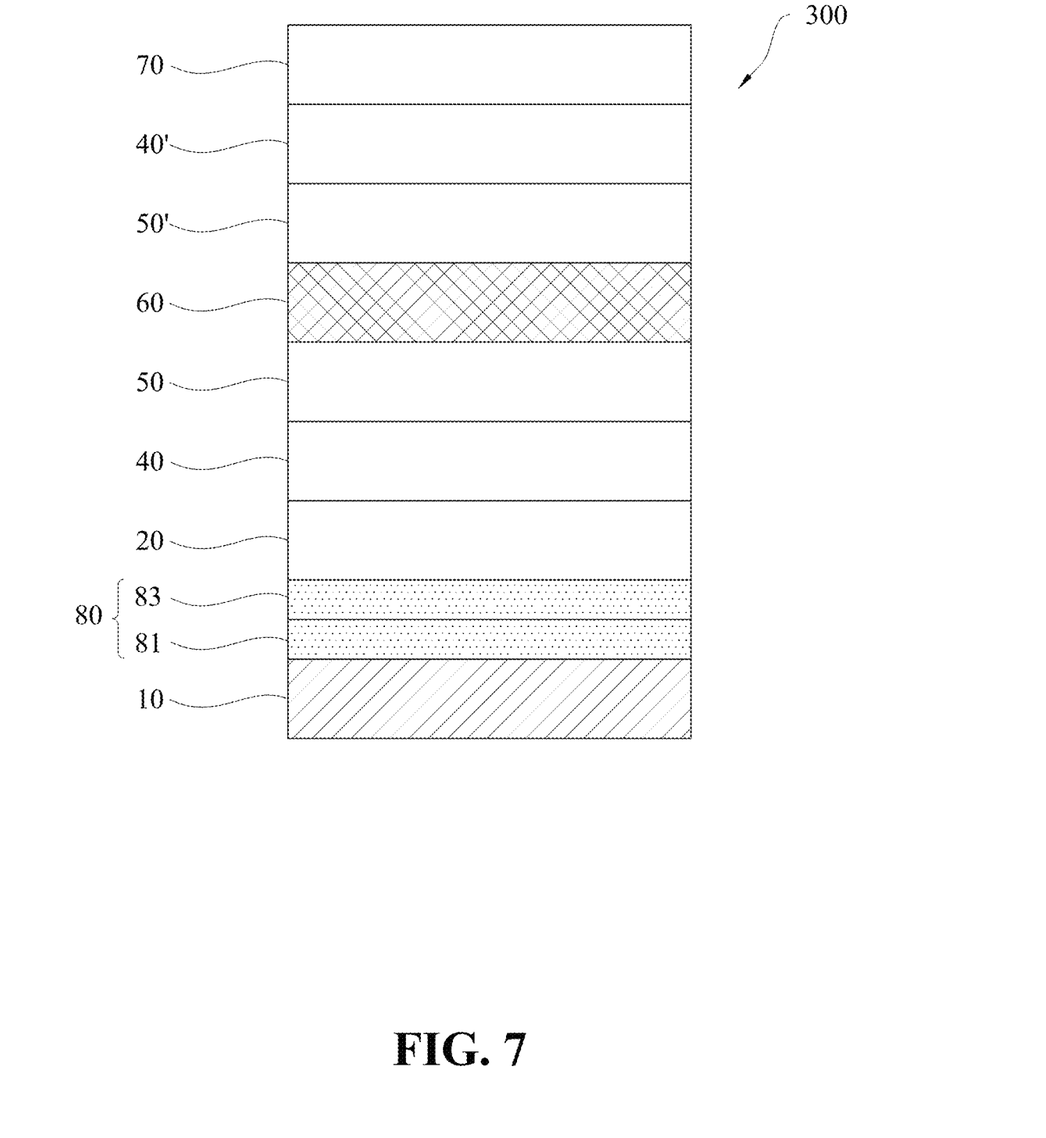
FIG. 7 is a schematic diagram illustrating the structure of an edge-emitting laser diode with a plurality of defect blocking layers stacked directly in an embodiment of the present invention.

Preferably, the defect blocking layer 80 may be a single-layer structure or a multilayer structure, and the material of the defect blocking layer 80 may be carbon-doped InGaAsP, carbon-doped InGaP, carbon-doped InAlGaP, carbon-doped InAlAsP, carbon-doped InAlGaAsP, carbon-doped GaAs, carbon-doped AlGaAs, carbon-doped AlGaAsP, oxygen-doped AlGaAs, oxygen-doped AlGaAsP, oxygen-doped InAlGaP, oxygen-doped InAlAsP, oxygen-doped InAlGaAsP, silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP. When the defect blocking layer has a multilayer structure, for example, as shown in FIG. 7, the defect blocking layer 80 is formed by a first defect blocking layer 81 and a second defect blocking layer 83 stacked directly.

Preferably, when doping carbon in the defect blocking layer 80, the doping concentration may be $1 \times 10^{18}$ cm$^3$ or more, preferably $1 \times 10^{19}$ cm$^3$ or more; when doping oxygen, the doping concentration may be $1 \times 10^{18}$ cm$^3$ or more, preferably $1 \times 10^{19}$ cm$^{-3}$ or more; when doping any one of silicon, tin, tellurium or selenium, the doping concentration may be $5 \times 10^{17}$ cm$^{-3}$ or more, preferably $5 \times 10^{18}$ cm$^3$ or more. Higher doping concentrations generally exhibit better defect blocking. In addition, in the case where the defect blocking layer 80 is made of the same material, doping with silicon, tin, tellurium or selenium shows better defect blocking than undoped, but doping with carbon or oxygen shows the best.

Preferably, the total thickness of the defect blocking layer 80 may be 1 nm to 10000 nm, or the first defect blocking layer 81 and the second defect blocking layer 83 may be 1 nm to 10000 nm in thickness, respectively.

Preferably, depending on application, the GaAs substrate 10 can be an n-type, a p-type or a semi-insulating substrate.

Preferably, when the GaAs substrate 10 is an n-type substrate, the defect blocking layer 80 deposited on the GaAs substrate 10 may be a single-layer structure or a multilayer structure, and the material of the defect blocking layer 80 may be silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP. As such, no PN junction will be formed between the n-type GaAs substrate 10 and the defect blocking layer 80 to contribute extra resistance, and this can block or reduce crystal defects propagation from the GaAs substrate 10 toward the quantum well layer 60, thereby improving the reliability and optical property of the edge-emitting laser diode 300.

Preferably, when the GaAs substrate 10 is a p-type substrate, the defect blocking layer 80 deposited on the GaAs substrate 10 may be a single-layer structure or a multilayer structure, and the material of the defect blocking layer 80 may be carbon-doped InAlGaP, carbon-doped InAlAsP, carbon-doped InAlGaAsP, carbon-doped GaAs, carbon-doped AlGaAs or carbon-doped AlGaAsP. As such, no PN junction will be formed between the p-type GaAs substrate 10 and the defect blocking layer 80 to contribute extra resistance, and this can block or reduce crystal defects propagation from the GaAs substrate 10 toward the quantum well layer 60, thereby improving the reliability and optical property of the edge-emitting laser diode 300.

Preferably, when the GaAs substrate 10 is a semi-insulating substrate, the defect blocking layer 80 deposited on the GaAs substrate 10 may be a single-layer structure or a multilayer structure, and the material of the defect blocking layer 80 may be carbon-doped InGaAsP, carbon-doped InGaP, carbon-doped InAlGaP, carbon-doped InAlAsP, carbon-doped InAlGaAsP, carbon-doped GaAs, carbon-doped AlGaAs, carbon-doped AlGaAsP, oxygen-doped AlGaAs, oxygen-doped AlGaAsP, oxygen-doped InAlGaP, oxygen-doped InAlAsP, oxygen-doped InAlGaAsP, silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP. As such, the defect blocking layer 80 can block or reduce crystal defects propagation from the GaAs substrate 10 toward the quantum well layer 60, thereby improving the reliability and optical property of the edge-emitting laser diode 300.

Figure 8:
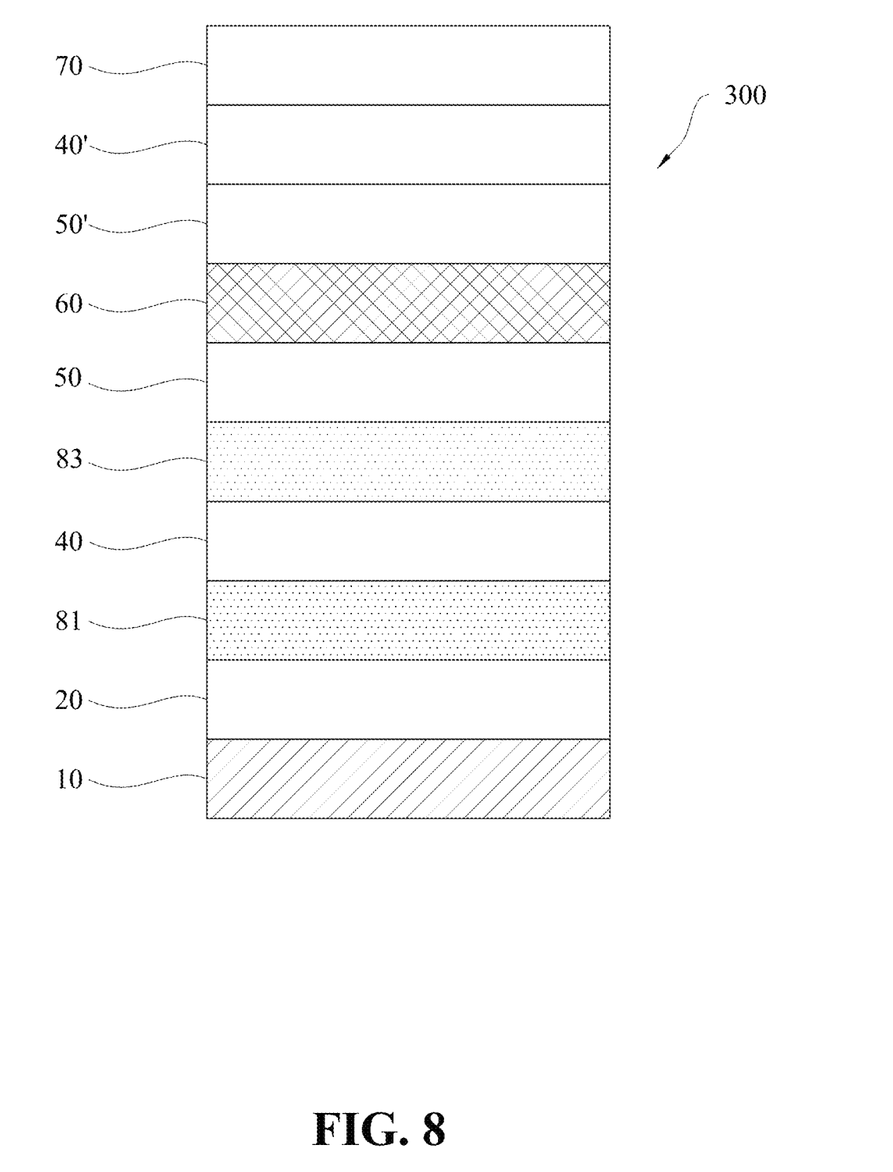
FIG. 8 is a schematic diagram illustrating the structure of an edge-emitting laser diode with a plurality of defect blocking layers stacked indirectly in an embodiment of the present invention.

As shown in FIG. 8, the multilayer defect blocking layer in the edge-emitting laser diode 300 may also be an indirect stack where the layers are not adjacent to each other. For example, the first defect barrier layer 81 may be deposited between the buffer layer 20 and the lower cladding layer 40 (indirectly deposited on the GaAs substrate 10), the second defect barrier layer 83 may be deposited between the lower cladding layer 40 and the lower spacer layer 50 (indirectly deposited on the GaAs substrate 10).

Preferably, when the edge-emitting laser diode 300 includes two or more defect blocking layers, the defect blocking layers may be respectively deposited at two or more of the following locations: between the GaAs substrate 10 and the buffer layer 20, in the buffer layer 20, between the buffer layer 20 and the lower cladding layers 40, in the lower cladding layer 40, between the lower cladding layer 40 and the lower spacer layer 50, in the lower spacer layer 50, or between the lower spacer layer 50 and the quantum well layer 60.

Figure 9:
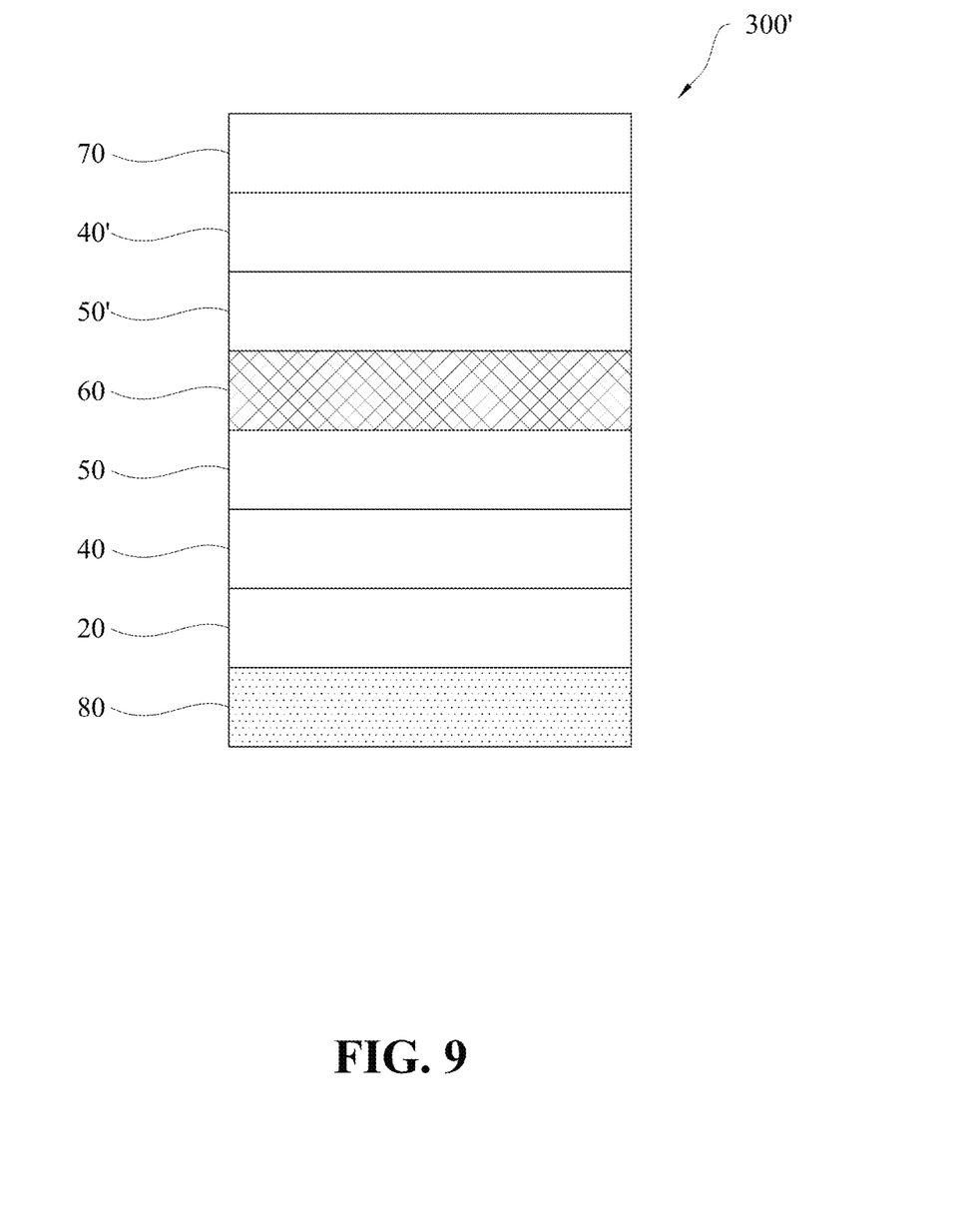
FIG. 9 is a schematic diagram illustrating the structure of an edge-emitting laser diode with substrate removed according to an embodiment of the invention.

Moreover, in an embodiment of the present invention, depending on the application, the GaAs substrate 10 may be removed after manufacturing the edge-emitting laser diode 300 to obtain a laser diode 300' shown in FIG. 9. At this point, the defect blocking layer 80 may be a single-layer structure or a multilayer structure, and the material of the defect blocking layer 80 may be carbon-doped InGaAsP, carbon-doped InGaP, carbon-doped InAlGaP, carbon-doped InAlAsP, carbon-doped InAlGaAsP, carbon-doped GaAs, carbon-doped AlGaAs, carbon-doped AlGaAsP, oxygen-doped AlGaAs, oxygen-doped AlGaAsP, oxygen-doped InAlGaP, oxygen-doped InAlAsP, oxygen-doped InAlGaAsP, silicon-doped InGaAsP, silicon-doped InGaP, silicon-doped InAlGaP, silicon-doped InAlAsP, silicon-doped InAlGaAsP, tin-doped InGaAsP, tin-doped InGaP, tin-doped InAlGaP, tin-doped InAlAsP, tin-doped InAlGaAsP, tellurium-doped InGaAsP, tellurium-doped InGaP, tellurium-doped InAlGaP, tellurium-doped InAlAsP, tellurium-doped InAlGaAsP, selenium-doped InGaAsP, selenium-doped InGaP, selenium-doped InAlGaP, selenium-doped InAlAsP, selenium-doped InAlGaAsP, undoped InGaAsP, undoped InGaP, undoped InAlGaP, undoped InAlAsP or undoped InAlGaAsP.

With the description of the above embodiments, as long as the edge-emitting laser diode of the present invention can provide at least one defect blocking layer under the quantum well layer (as the active layer), the defect blocking layer can block or reduce the crystal defects of the GaAs substrate propagation upward, thereby reducing crystal defects in the quantum well layer, and the reliability and optical property of the laser diode are improved. In addition, the defect blocking layer can also reduce the crystal defect specification requirements of the substrate, and relatively increase the substrate manufacturing yield, thereby further reducing the cost.

Figure 10:
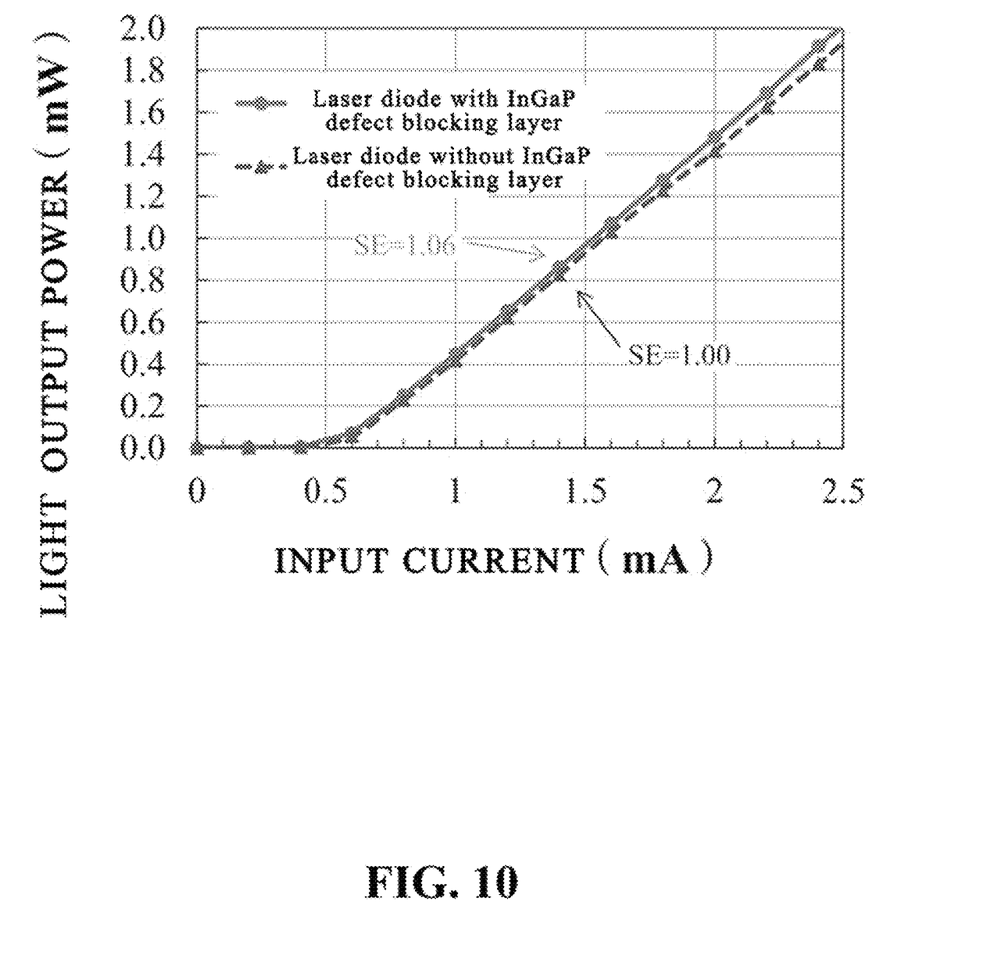
FIG. 10 is a light output power versus input current (L-I) curve of the surface-emitting laser diode with the single defect blocking layer shown in FIG. 2.

FIG. 10 is a L-I curve of the surface-emitting laser diode with the single defect blocking layer shown in FIG. 2. The L-I curve shows the relation between the input current of the laser diode and the light output power. The defect blocking layer 80 of the surface-emitting laser diode 200 is formed of Si doped InGaP having a thickness of 144.5 nm and the doping concentration of $2\times10^{18}$ cm$^{-3}$.

The L-I curve of FIG. 10 also shows that when the input current is greater than the threshold current of the laser diode, the relationship between input current and light output power is an approximate straight line, the slope of the straight line is called Slope Efficiency (SE) used to evaluate the optical properties of the laser diode.

A surface-emitting laser diode, having an InGaP defect blocking layer in the embodiments of the present invention, compared with a laser diode without InGaP defect blocking layer in the prior art. The SE of present invention is higher than that of conventional one (1.06 W/A V.S 1.00 W/A). It is clear that the surface-emitting laser diode in the embodiments of the present invention have better efficiency than the conventional laser diode under the same input current. When the defect blocking layer of the present invention is provided in a plurality of layers or in the case of using other doped semiconductor described above, the SE value can also be increased.

Further, in the edge-emitting laser diode in the embodiments of the present invention, the SE value can be increased, as long as defect blocking layer is disposed the same as the above described surface-emitting laser diode.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A surface-emitting laser diode with defect blocking layer, at least comprising:
   a GaAs substrate;
   an active layer; and
   at least a defect blocking layer, deposited between the GaAs substrate and the active layer to block or reduce defect propagation from the GaAs substrate to the active layer;
   wherein the material of the defect blocking layer is carbon-doped InGaP, carbon-doped InAlGaP, carbon-doped InAlAsP, carbon-doped InAlGaAsP, carbon-doped GaAs, carbon-doped AlGaAsP, oxygen-doped AlGaAsP, oxygen-doped InAlGaP, oxygen-doped InAlAsP, oxygen-doped InAlGaAsP, tin-doped InGaP, tin-doped InAlGaP, tin-doped InAlAsP, tin-doped InAlGaAsP, wherein when doping carbon in the defect blocking layer, the doping concentration is $1\times10^{18}$ cm$^{-3}$ or more, when doping oxygen in the defect blocking layer, the doping concentration is $1\times10^{18}$ cm$^{-3}$ or more, and when doping tin in the defect blocking layer, the doping concentration is $5\times10^{18}$ cm$^{-3}$ or more, and wherein the GaAs substrate is an n-type substrate, and the defect blocking layer is deposited directly or indirectly on the GaAs substrate.

2. The surface-emitting laser diode with defect blocking layer according to claim 1, wherein the active layer comprises at least a layer of quantum well structure.

3. The surface-emitting laser diode with defect blocking layer according to claim 1, wherein there are two or more defect blocking layers, and the defect blocking layers are stacked directly or stacked indirectly.

4. The surface-emitting laser diode with defect blocking layer according to claim 1, wherein the defect blocking layer has a thickness of from 1 nm to 10000 nm.

5. The surface-emitting laser diode with defect blocking layer according to claim 1, wherein the GaAs substrate is further processed to be removed.

6. A edge-emitting laser diode with defect blocking layer, at least comprising:
   a GaAs substrate;
   an active layer; and
   at least a defect blocking layer, deposited between the GaAs substrate and the active layer to block or reduce defect propagation from the GaAs substrate to the active layer;
   wherein the material of the defect blocking layer is carbon-doped InGaP, carbon-doped InAlGaP, carbon-doped InAlAsP, carbon-doped InAlGaAsP, carbon-doped GaAs, carbon-doped AlGaAsP, oxygen-doped AlGaAsP, oxygen-doped InAlGaP, oxygen-doped InAlAsP, oxygen-doped InAlGaAsP, tin-doped InGaP, tin-doped InAlGaP, tin-doped InAlAsP, tin-doped InAlGaAsP, and wherein when doping carbon in the defect blocking layer, the doping concentration is $1\times10^{18}$ cm$^{-3}$ or more, when doping oxygen in the defect blocking layer, the doping concentration is $1\times10^{18}$ cm$^{-3}$ or more, and when doping tin in the defect blocking layer, the doping concentration is $5\times10^{18}$ cm$^{-3}$ or more, and wherein the GaAs substrate is an n-type substrate, and the defect blocking layer is deposited directly or indirectly on the GaAs substrate.

7. The edge-emitting laser diode with defect blocking layer according to claim 6, wherein the active layer comprises at least a layer of quantum well structure.

8. The edge-emitting laser diode with defect blocking layer according to claim 6, wherein there are two or more defect blocking layers, and the defect blocking layers are stacked directly or stacked indirectly.

9. The edge-emitting laser diode with defect blocking layer according to claim 6, wherein the defect blocking layer has a thickness of from 1 nm to 10000 nm.

10. The edge-emitting laser diode with defect blocking layer according to claim 6, wherein the GaAs substrate is further processed to be removed.

\* \* \* \* \*